United States Patent
Foo et al.

(10) Patent No.: US 7,675,336 B1
(45) Date of Patent: Mar. 9, 2010

(54) CLOCK DUTY CYCLE RECOVERY CIRCUIT

(75) Inventors: Kok Yoong Foo, Bayan Lepas (MY); Tze Haw Liew, Sarawak (MY); Joo Ming Too, Kedah (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/016,394

(22) Filed: Dec. 17, 2004

(51) Int. Cl.
H03K 3/017 (2006.01)
H03K 5/04 (2006.01)
H03K 7/08 (2006.01)

(52) U.S. Cl. .................... 327/175; 327/161; 327/115; 327/158

(58) Field of Classification Search ............... 327/175, 327/291, 292, 299, 115, 158, 161, 117
See application file for complete search history.

(56) References Cited

U.S. PATENT DOCUMENTS

| | | | |
|---|---|---|---|
| 5,463,337 A * | 10/1995 | Leonowich | 327/158 |
| 5,757,218 A * | 5/1998 | Blum | 327/175 |
| 5,801,559 A * | 9/1998 | Sawai et al. | 327/116 |
| 6,150,847 A * | 11/2000 | Lu | 326/93 |
| 6,150,855 A * | 11/2000 | Marbot | 327/116 |
| 6,215,726 B1 * | 4/2001 | Kubo | 365/233 |
| 6,426,660 B1 * | 7/2002 | Ho et al. | 327/175 |
| 6,639,441 B2 * | 10/2003 | Ono et al. | 327/175 |
| 6,653,876 B2 * | 11/2003 | Issa et al. | 327/158 |
| 6,927,642 B2 * | 8/2005 | Hsieh | 331/175 |
| 2002/0117918 A1 * | 8/2002 | Shimizu et al. | 310/77 |
| 2003/0151433 A1 * | 8/2003 | Takai | 327/158 |
| 2005/0105636 A1 * | 5/2005 | Belau et al. | 375/295 |

\* cited by examiner

*Primary Examiner*—Quan Tra
(74) *Attorney, Agent, or Firm*—Townsend and Townsend and Crew LLP; J. Matthew Zigmant

(57) ABSTRACT

Circuits, methods, and apparatus that provide the improvement or recovery of a duty cycle of a clock signal. One embodiment of the present invention receives a clock signal that may have a degraded duty cycle. The frequency of the clock signal is divided by two. The frequency-divided signal is delayed in order to generate two signals that are phase shifted from one another by 90 degrees. These signals are then exclusive-ORed together to generate a recovered clock. A control loop is provided to adjust the phase shift between the signals to be approximately 90 degrees.

39 Claims, 10 Drawing Sheets

CLOCK DUTY CYCLE RECOVERY CIRCUIT

BACKGROUND

The present invention relates to clock circuits for integrated circuits generally, and more particularly to circuits for improving the duty cycle of clock signals on integrated circuits.

Digital and mixed signal integrated circuits use clock signals to transfer data from one circuit block to another, to time data, to ensure that data flows through the chip in an orderly sequential manner, and for other purposes.

The duty cycle of these clock signals should generally be close to 50 percent to ensure optimum circuit performance. That is, for each cycle, the clock signal should be at a logic low level and a logic high level for nearly equal durations. This promotes reliable clocking of circuits and their data. A clock signal having a duty cycle that deviates far from 50 percent may have such short high or low times that the clock signal is not seen by a circuit being clocked. Also, some circuits transfer data on each edge of a clock signal, that is, on each rising and falling edge. Other circuits clock data on a rising edge but communicate with another that clocks data on the falling edge—if the edges are too close data may not transfer from one circuit to the next.

The duty of a clock may become distorted by many circuit phenomena. For example, the edge rates provided by a driving circuit may be mismatched due to process variations or other mismatches. That is, a clock driver may provide rising edges that are faster that its falling edges. Also, the trip point or threshold may not be centered for a driving circuit that is receiving and amplifying a clock signal. Capacitive loading and inductive effects can also distort a clock signal's duty cycle.

Traditional solutions include circuits such as phase-locked loops that can recover or regenerate a clock signal's duty cycle. But these circuits are large and tend to consume a great deal of power and die area.

Thus, what is needed are circuits, methods, and apparatus for recovering or regenerating a clock signal's duty cycle without the use of complicated circuitry.

SUMMARY

Accordingly, embodiments of the present invention provide circuits, methods, and apparatus that provide the improvement or recovery of a duty cycle of a clock signal. One embodiment of the present invention receives a clock signal that may have a degraded duty cycle. The frequency of the clock signal is divided by two. The frequency-divided signal is delayed in order to generate two signals that are phase shifted from one another by 90 degrees. These signals are then exclusive-ORed together to generate a recovered clock. A control loop is provided to adjust the phase shift between the signals to be approximately 90 degrees. Various embodiments of the present invention may incorporate one or more of these or the other features described herein.

A better understanding of the nature and advantages of the present invention may be gained with reference to the following detailed description and the accompanying drawings.

DESCRIPTION OF EXEMPLARY EMBODIMENTS

Figure 1:
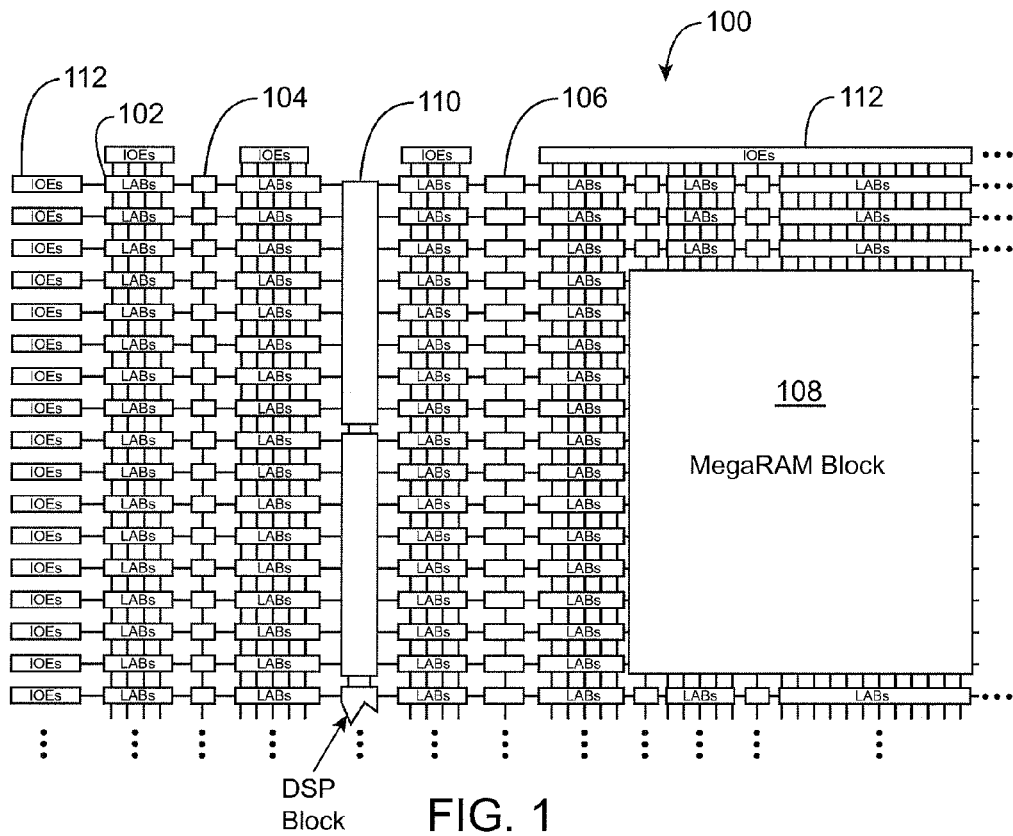
FIG. 1 is a simplified block diagram of a programmable logic device that may benefit by incorporating embodiments of the present invention.

FIG. 1 is a simplified partial block diagram of an exemplary high-density programmable logic device 100 wherein techniques according to the present invention can be utilized. PLD 100 includes a two-dimensional array of programmable logic array blocks (or LABs) 102 that are interconnected by a network of column and row interconnections of varying length and speed. LABs 102 include multiple (e.g., 10) logic elements (or LEs), an LE being a small unit of logic that provides for efficient implementation of user defined logic functions.

PLD 100 also includes a distributed memory structure including RAM blocks of varying sizes provided throughout the array. The RAM blocks include, for example, 512 bit blocks 104, 4K blocks 106, and an M-Block 108 providing 512K bits of RAM. These memory blocks may also include shift registers and FIFO buffers. PLD 100 further includes digital signal processing (DSP) blocks 110 that can implement, for example, multipliers with add or subtract features.

It is to be understood that PLD 100 is described herein for illustrative purposes only and that the present invention can be implemented in many different types of PLDs, FPGAs, and the other types of digital integrated circuits.

Figure 2:
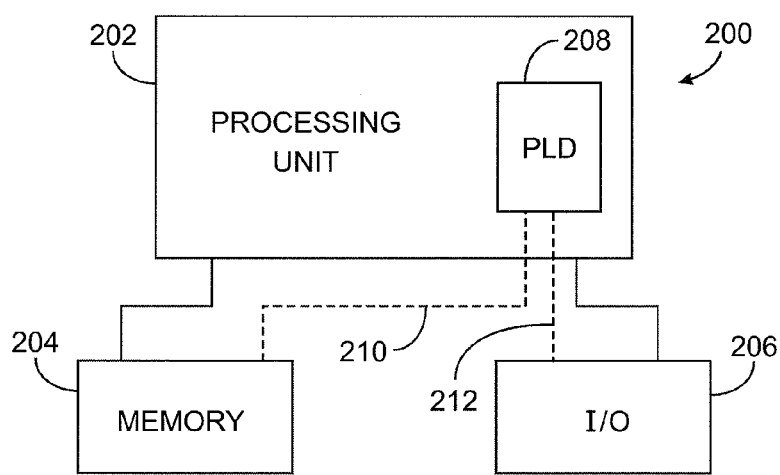
FIG. 2 is a block diagram of an electronic system that may benefit by incorporating embodiments of the present invention.

While PLDs of the type shown in FIG. 1 provide many of the resources required to implement system level solutions, the present invention can also benefit systems wherein a PLD is one of several components. FIG. 2 shows a block diagram of an exemplary digital system 200, within which the present invention may be embodied. System 200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 200 may be provided on a single board, on multiple boards, or within multiple enclosures.

System 200 includes a processing unit 202, a memory unit 204 and an I/O unit 206 interconnected together by one or more buses. According to this exemplary embodiment, a programmable logic device (PLD) 208 is embedded in processing unit 202. PLD 208 may serve many different purposes within the system in FIG. 2. PLD 208 can, for example, be a logical building block of processing unit 202, supporting its internal and external operations. PLD 208 is programmed to implement the logical functions necessary to carry on its particular role in system operation. PLD 208 may be specially coupled to memory 204 through connection 210 and to I/O unit 206 through connection 212.

Processing unit 202 may direct data to an appropriate system component for processing or storage, execute a program stored in memory 204 or receive and transmit data via I/O unit 206, or other similar function. Processing unit 202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 208 can control the logical operations of the system. In an embodiment, PLD 208 acts as a reconfigurable processor, which can be reprogrammed as needed to handle a particular computing task. Alternately, programmable logic device 208 may itself include an embedded microprocessor. Memory unit 204 may be a random access memory (RAM), read only memory (ROM), fixed or flexible disk media, PC Card flash disk memory, tape, or any other storage means, or any combination of these storage means.

Figure 3:
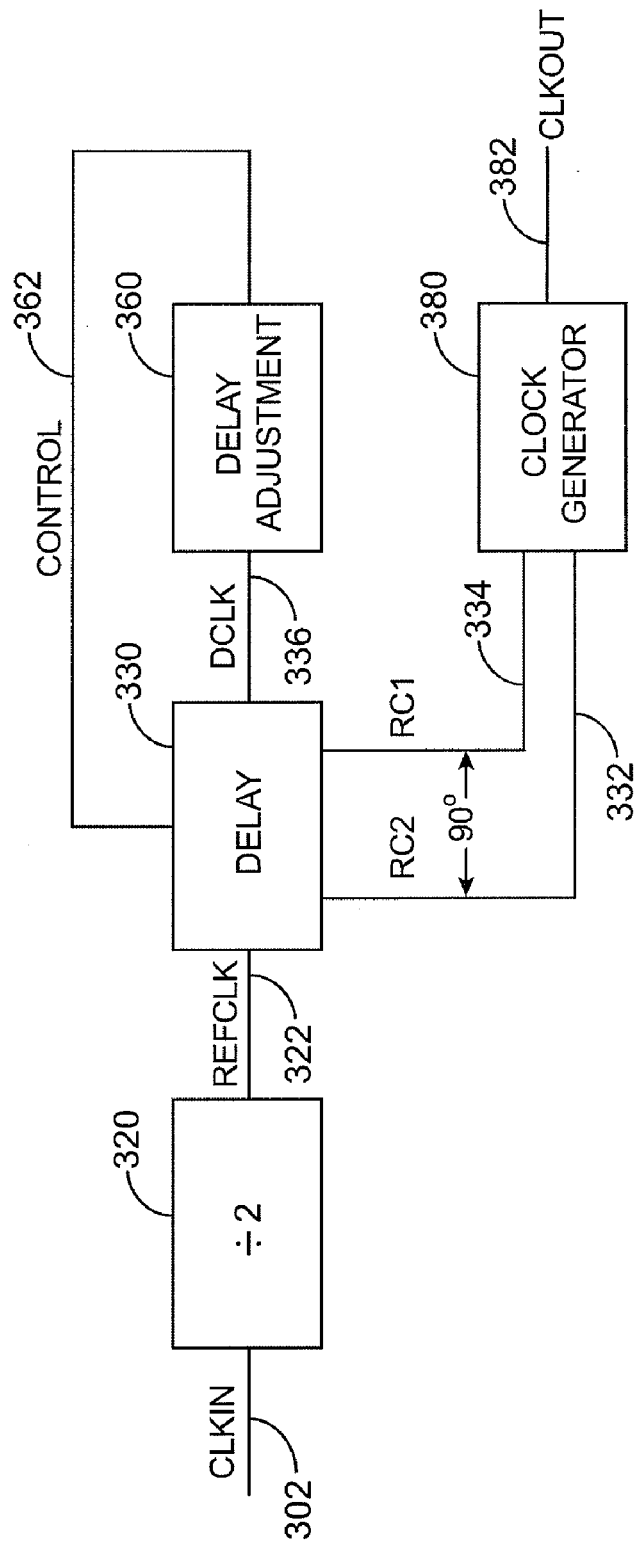
FIG. 3 is a block diagram of a duty cycle improving circuit consistent with an embodiment of the present invention.

FIG. 3 is a block diagram of a duty cycle improving circuit consistent with an embodiment of the present invention. This block diagram includes a divider circuit 320, delay circuit 330, delay adjustment circuit 360, and clock generator 380. This figure, as with the other included figures, is shown for illustrative purposes only and does not limit either the possible embodiments of the present invention or the claims.

A clock or periodic signal CLKIN is received on line 302 by the divider circuit 320. The divider circuit 320 divides the frequency of CLKIN and provides an output REFCLK on line 322. In this particular example, the divider circuit 320 divides the frequency of the CLKIN signal by a factor of two, that is, it provides an output signal having a frequency that is half the frequency of CLKIN. In a specific embodiment, the divide-by-two circuit may be a D flip-flop having its inverted output connected to its data input and its clock input connected to receive CLKIN.

The delay circuit 330 receives the lower frequency REFCLK signal on line 322 and provides two signals, RC2 on line 332 and RC1 on line 334. These two signals are phase shifted versions of the lower frequency REFCLK signal and are separated from each other in phase by approximately 90 degrees. In various embodiments of the present invention, RC2 on line 332 may be the same signal as the REFCLK signal on line 322. Also, in various embodiments of the present invention, signal RC1 on line 334 is the same signal as signal DCLK on line 336, which is provided to the delay adjustment circuit 360. In a particular embodiment, the delay is generated by a capacitance being discharged by a current under the direction of a control signal on line 362.

The delay adjustment circuit 360 generates the control signal on line 362 that is used to adjust the phase delay between the signals RC2 on line 332 and RC1 on line 334 to approximately 90 degrees. In various embodiments, the delay adjustment 360 may make use of signals REFCLK on line 322, RC2 on line 332, or RC1 on line 334, as well as the output of the delay circuit key clocks on line 336. In a particular embodiment, the delay adjustment circuit is a counter and the control signal is a six-bit wide word, though other embodiments use a different number of control bits or an analog signal.

The clock generator 380 receives phase-shifted signals RC2 on line 332 and RC1 on line 334 and provides an output clock signal on line 382. The resulting clock signal has a restored, recovered, or improved duty cycle. In other embodiments of the present invention, the clock generator may receive the REFCLK signal on line 322, or the output of the delay circuit 330 DCLK on line 336. In a particular embodiment of the present invention, the clock generator circuit 380 may be an exclusive-OR gate.

Figure 4:
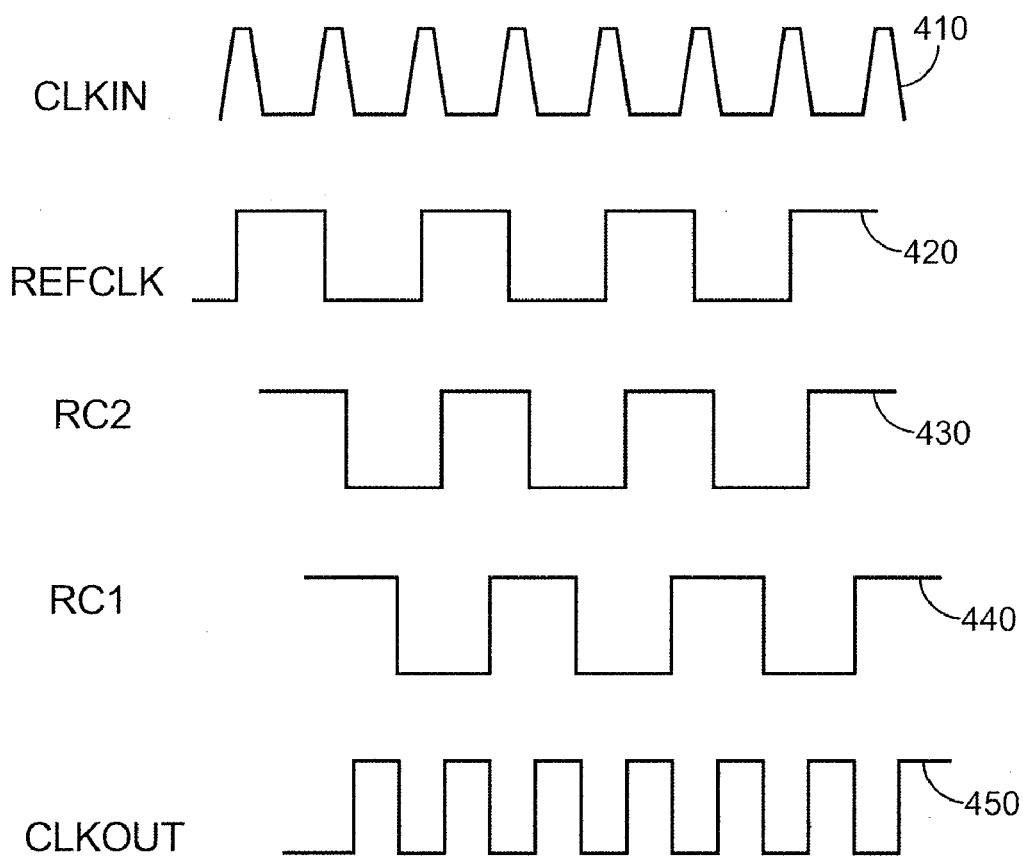
FIG. 4 is a timing diagram showing exemplary signals for the block diagram of FIG. 3.

FIG. 4 is a timing diagram showing exemplary signals for the block diagram of FIG. 3. This timing diagram includes waveforms CLKIN 410, which corresponds to CLKIN on line 302, REFCLK 420, corresponding to REFCLK on line 322, RC2 430, corresponding to RC2 on line 332, RC1 440, corresponding to RC1 on line 334, and CLKOUT 450, corresponding to CLKOUT on line 382.

CLKIN 410 has a duty cycle that has been distorted, for example by stray capacitance, mismatches between rising and falling edges of source signals provided by driving gates, and other causes well known to one skilled in the art. REFCLK 420 is a periodic signal having half the frequency of the CLKIN signal 410. In this specific example, each rising edge of CLKIN 410 generates a transition in the REFCLK signal 420. In other embodiments, the falling edge of CLKIN 410 may be used to generate a transition of REFCLK 420.

The signals RC2 430 and RC1 440 are delayed versions of the REFCLK signal 420. In various embodiments, RC2 430 may be the same as REFCLK 420. RC2 430 and RC1 440 are separated by 90 degrees and are exclusive-ORed together to generate the CLKOUT to signal 450. The CLKOUT signal 450 is a duty-cycle improved version of the CLKIN signal 410.

Figure 5:
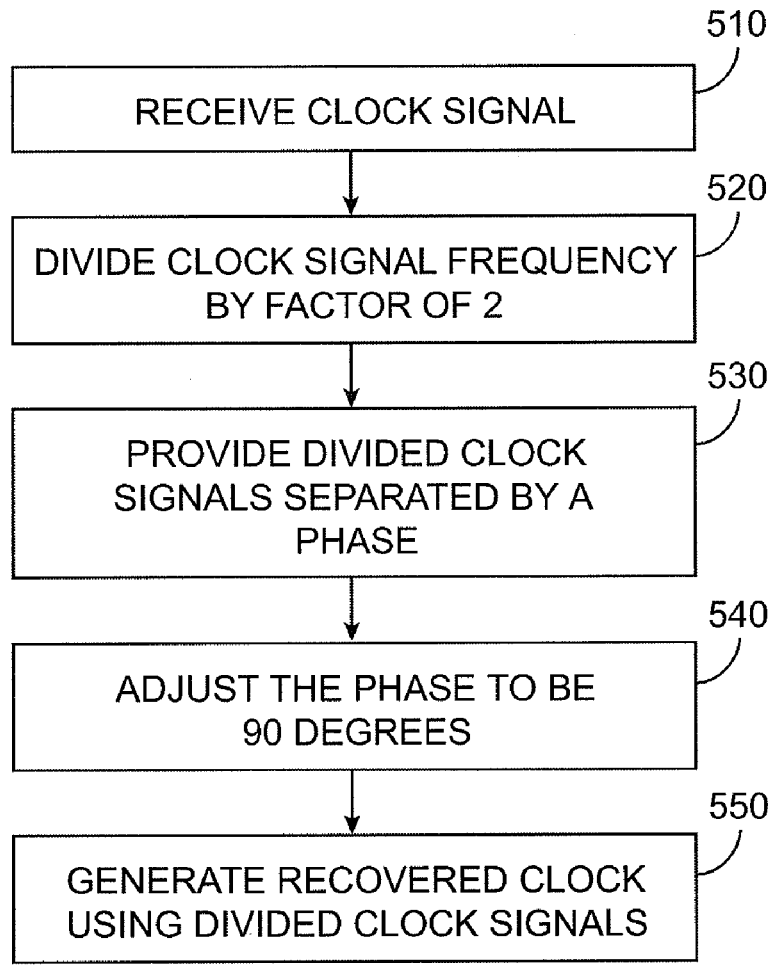
FIG. 5 is a flow chart of a method of improving the duty cycle of a clock signal according to an embodiment of the present invention.

FIG. 5 is a flow chart of a method of improving the duty cycle of a clock signal according to an embodiment of the present invention. In act 510, a clock signal is received. The frequency of this clock signal is divided by a factor of two in act 520. In act 530, two frequency-divided clock signals separated by a phase are provided. In act 540, this phase is adjusted to be approximately 90 degrees. In act 550, the recovered clock signal is generated using the two frequency-divided clock signals that are separated by approximately 90 degrees.

Figure 6:
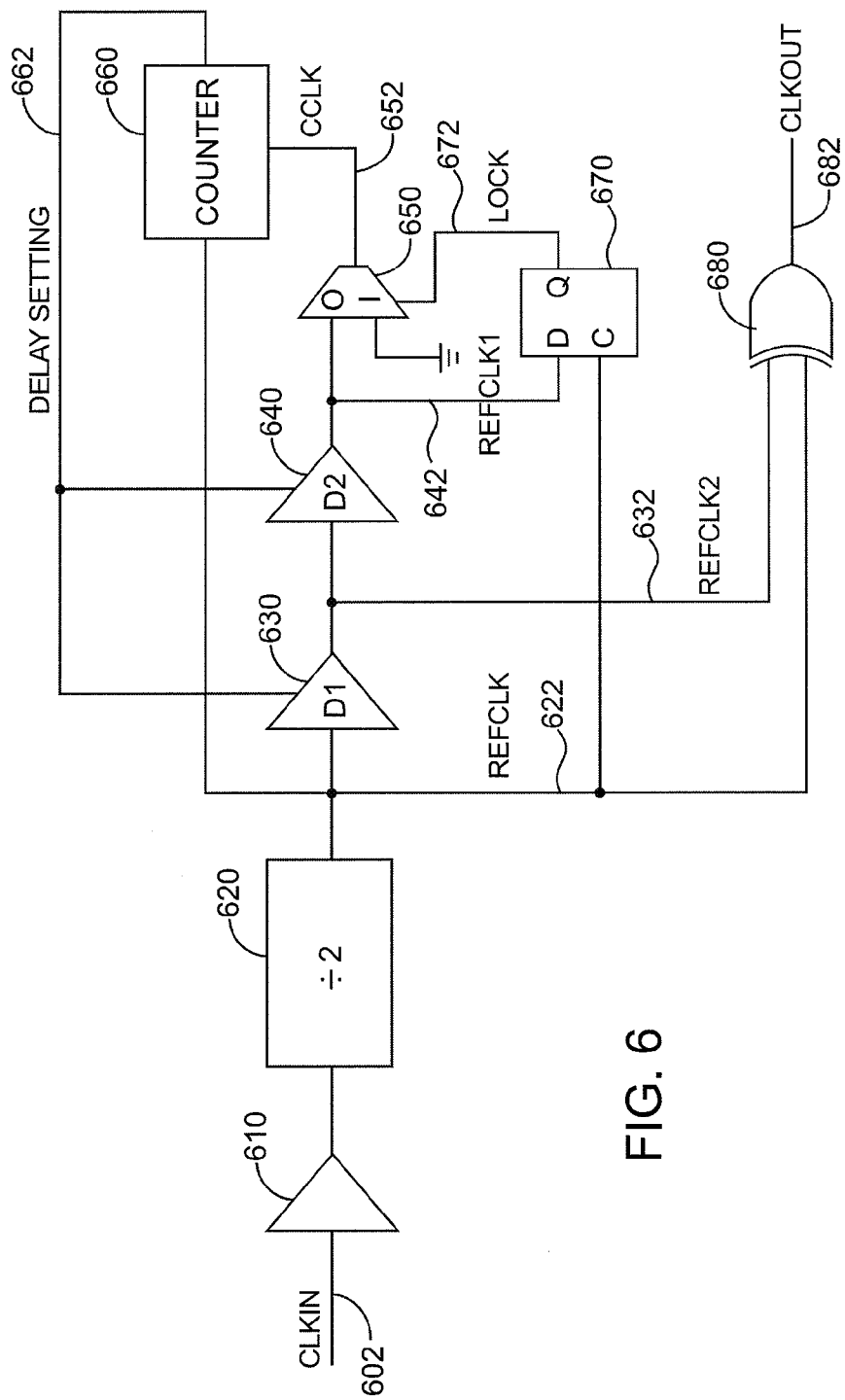
FIG. 6 is a block diagram of another duty cycle improving circuit consistent with an embodiment of the present invention.

FIG. 6 is a block diagram of another duty-cycle improving circuit that is consistent with an embodiment of the present invention. This block diagram includes a buffer 610, divider circuit 620, delay circuits 630 and 640, multiplexer 650, counter 660, flip-flop 670, and exclusive-OR gate 680.

A clock or other periodic signal CLKIN is received on line 602 by the buffer 610. This buffer gains the received clock signal and provides an output to the divider circuit 620. The gain provided by the buffer squares the received input signal and helps reduce jitter in later stages of the circuit. The divider circuit divides the frequency of the clock signal by a factor of two and provides an output signal REFCLK on line 622. The REFCLK signal is delayed by delay elements D1 630 and D2 640 to generate a delayed frequency-divided clock signal REFCLK2 on line 632 and a delayed delayed-frequency-divided clock signal REFCLK1 on line 642.

The delay through the delay circuits D1 630 and D2 640 is controlled by a delay setting control signal on line 662 that is provided by the counter 660. In a specific embodiment of the present invention, the delay setting control signal on line 662 is a 6 bit wide control word. The counter 660 is clocked by the CCLK signal on line 652. This multiplexed signal is either the delayed frequency-divided clock signal REFCLK1 on line 642 or a logic low signal. The selection between these two signals is made by multiplexer 650. Multiplexer 650 selects between these signals under control of a LOCK signal on line 672 that is provided by the register 670.

Specifically, under initial conditions, the delay through delay elements D1 630 and D2 640 are a relatively short, that is, the phase shift provided through each element is less than 90 degrees. Accordingly, during a rising edge of the REFCLK signal on line 622, the REFCLK1 signal on line 642 is at a logic low level. During this time, the LOCK signal on line 672 remains low and rising edges of the REFCLK1 signal on line 642 clock the counter 660. As the counter 660 is clocked, the delay setting control signal on line 662 is incremented (or decremented depending on the exact logic configuration used), thus increasing the delays through delay D1 630 and D2 640. In other embodiments, the initial conditions may be such that the initial delays are relatively long and then made progressively shorter.

At some point, the delay through the delay elements D1 630 and D2 640 reaches 180 degrees. When this happens, rising edges of REFCLK on line 622 occur while the REFCLK1 signal on line 642 is at a logic high level, causing the LOCK signal on line 672 to go high. The multiplexer 650 selects its logic low input signal for the CCLK signal on line 652 and the counter 660 stops incrementing. At this time, the phase delay through the delay circuit D1 630 and D2 640 are each approximately 90 degrees.

This means that REFCLK on line 622 and the REFCLK2 signal on line 632 are separated by 90 degrees. These two signals may be exclusive-ORed by the exclusive-OR gate 680 to provide the CLKOUT signal on line 682.

Figure 7:
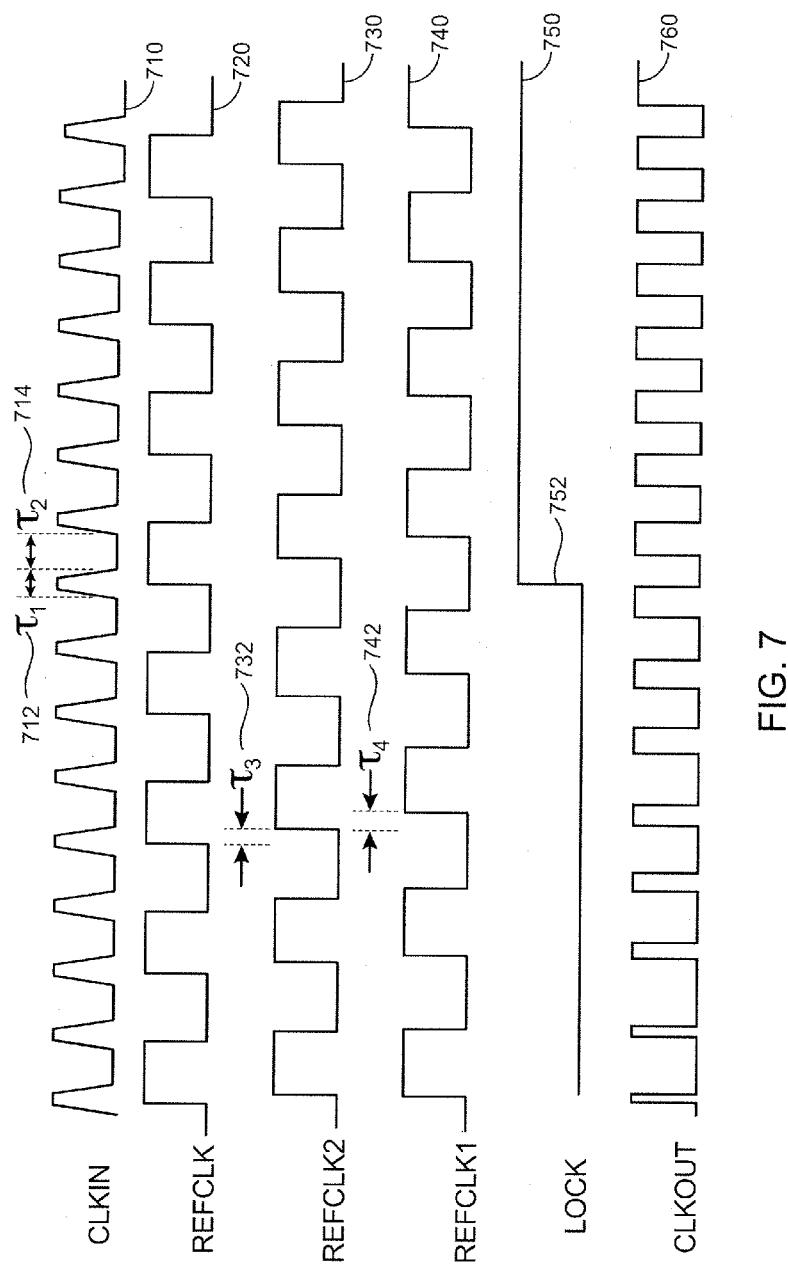
FIG. 7 is a timing diagram showing exemplary signals for the block diagram of FIG. 6.

FIG. 7 is a timing diagram showing the relative timing of exemplary signals for the block diagram of FIG. 6. This timing diagram includes a clock signal CLKIN 710 having a distorted duty cycle, which corresponds to signal CLKIN on line 602, REFCLK 720, which corresponds to REFCLK on line 622, REFCLK2 730, which corresponds to REFCLK2 on line 632, REFCLK1 740, which corresponds to REFCLK1 on line 642, LOCK 750, which corresponds to LOCK signal on line 672, and CLKOUT signal 760, which corresponds to the CLKOUT signal on line 682.

The CLKIN signal 710 is a periodic signal having a duty cycle that is not 50 percent due to stray capacitances, mismatches between driving circuits rising and falling edge rates, and other sources known to one skilled in the art. In this particular example, $T_1$ 712 and $T_2$ 714 are mismatched, thus the duty cycle is not 50 percent.

The REFCLK signal 720 has a frequency that is one-half that of the CLKIN signal 710. In this particular example, each rising edge of the CLKIN signal 710 is used to generate a transition in the REFCLK signal 720. In other embodiments, the falling edge of the CLKIN signal 710 may be used to generate a transition in the REFCLK signal 720.

The REFCLK2 signal 730 is delayed from the REFCLK signal 720 by a duration $T_3$ 732. Initially this duration is short, however with succeeding rising edges of the REFCLK 720, the counter is incremented, thus increasing the delay $T_3$ 732. Similarly, the REFCLK1 signal 740 is delayed from the REFCLK2 signal 730 by a duration $T_4$ 742.

At time 752, the rising edge of REFCLK 720 occurs while REFCLK1 740 is still high. When this happens, the lock signal 750 transitions to a high and the counter stops incrementing. In this state, the REFCLK signal 720 and REFCLK2 signal 730 are separated by approximately 90 degrees. Similarly, the REFCLK1 signal 740 and REFCLK2 signal 730 are separated by approximately 90 degrees. Accordingly, the REFCLK signal 720 and REFCLK2 signal 730 may be exclusive-ORed to generate the CLKOUT signal 760. Alternately, the REFCLK2 signal 730 and REFCLK1 signal 740 may be exclusive-ORed to generate the CLKOUT signal 760.

Figure 8:
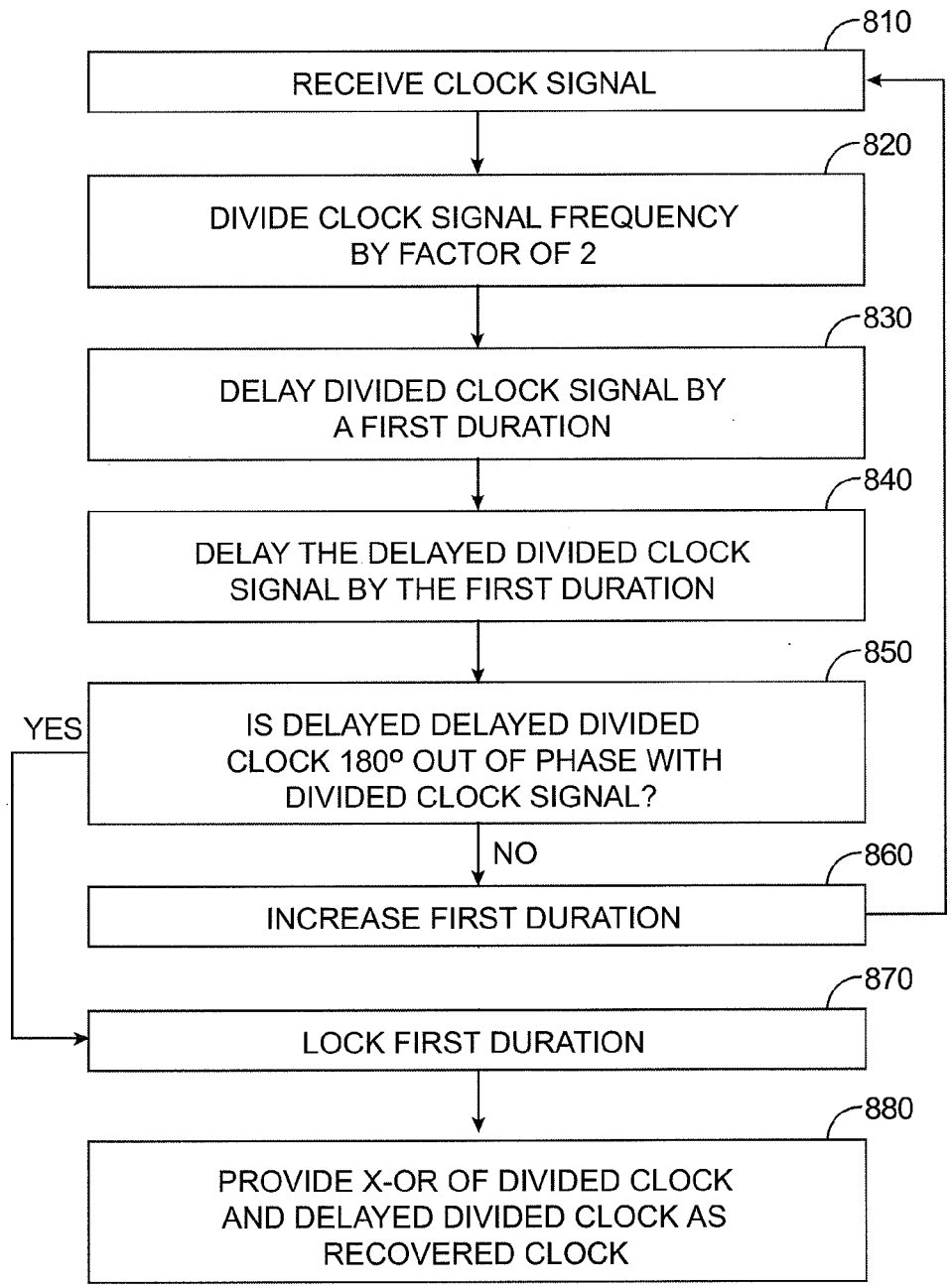
FIG. 8 is a flow chart of another method of improving the duty cycle of a clock signal according to an embodiment of the present invention.

FIG. 8 is a flow chart of another method of improving the duty cycle of a clock signal according to an embodiment of the present invention. In act 810, a clock signal is received. In act 820, the clock signal frequency is divided by a factor two. The divided clock signal is delayed by a first duration in act 830, and this signal is delayed again in act 840. If the twice delayed frequency-divided clock signal is 180 degrees out of phase of the divided clock signal, the first delay may be locked in act 870. If the signals have not reached the point where they are 180 degrees out of phase, the first duration is increased in act 860. The exclusive OR of the frequency-divided clock and the delayed frequency-divided clock may be provided as a recovered clock in act 880.

Figure 9:
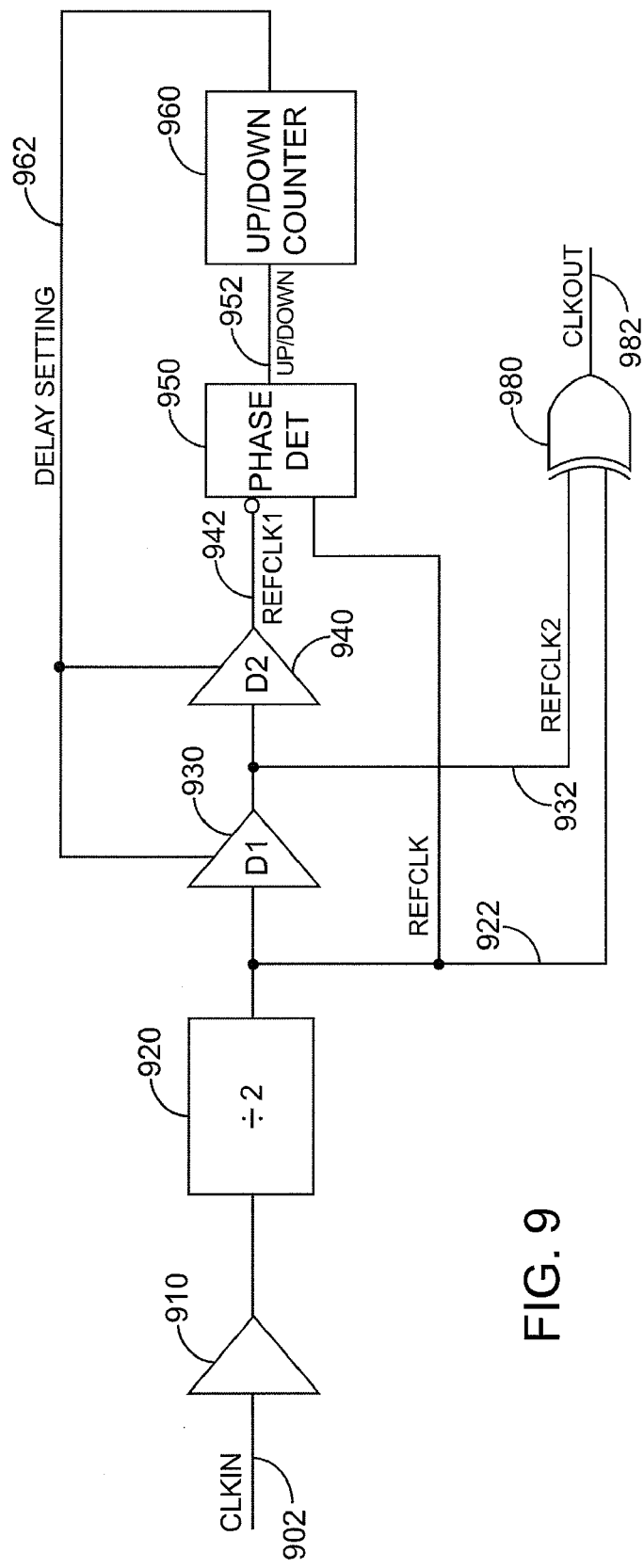
FIG. 9 is a block diagram of another duty cycle improving circuit consistent with an embodiment of the present invention.

FIG. 9 is a block diagram of another duty cycle improving circuit consistent with an embodiment of the present invention. This block diagram includes a buffer 910, frequency divider circuit 920, delay circuits D1 930 and D2 940, phase detector 950, up-down counter 960, and exclusive-OR gate 980.

A clock signal or other periodic signal CLKIN is received on line 902 by the input buffer 910. The divider circuit 920 divides the frequency of this clock signal by a factor of two and provides a REFCLK output signal on line 922. The REFCLK signal on line 922 is delayed by delay circuit 930 to generate REFCLK2 on line 932, which in turn is delayed by delay circuit D2 940 in order to generate REFCLK1 on line 942.

The phase of REFCLK on line 922 and the phase of the inverse of REFCLK1 on line 942 are compared by the phase detector 950. An up-down signal is provided on line 952 to the up-down counter 960. The up-down counter 960 in turn provides a delay setting control signal on line 962 to the delay circuits D1 930 and D2 940. The up-down counter is configured to adjust the delay through the delay circuit D1 930 and D2 940 such that rising edges of the REFCLK signal 922 are aligned with falling edges of the REFCLK1 signal 942. Under these conditions, the delay through the delay circuit D1 930 and D2 940 are each 90 degrees, assuming that the delays through delay circuits D1 930 and D2 940 are matched.

As before, two of the signals that are separated by 90 degrees, in this particular example the REFCLK signal on line 922 and the REFCLK2 signal on line 932, are exclusively-ORed by the exclusive-OR gate 980 to generate the CLKOUT signal on line 982. In other embodiments, four delay elements can be used, where the input to the first delay element and output of the last delay element are phase-compared. In this case, each element provides 90 degrees phase shift and the output and input of any element may be exclusive-ORed to generate a clock signal.

Figure 10:
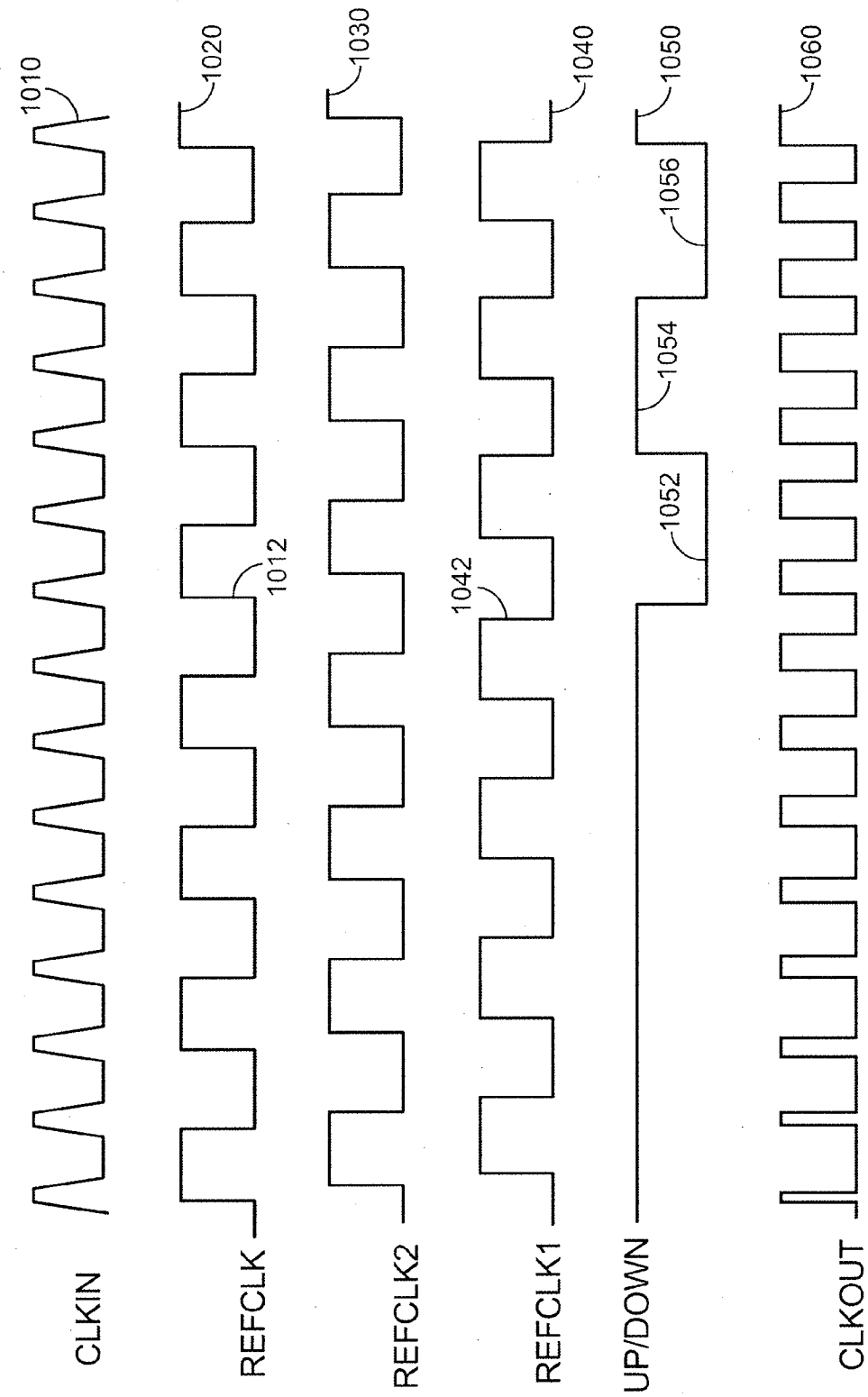
FIG. 10 is a timing diagram showing exemplary signals for the block diagram of FIG. 9.

FIG. 10 is a timing diagram showing exemplary signals for the block diagram of FIG. 9. This timing diagram includes a clock signal CLKIN 1010 having a distorted duty cycle, which corresponds to signal CLKIN on line 902, REFCLK 1020, which corresponds to REFCLK on line 922, REFCLK2 1030, which corresponds to REFCLK2 on line 932, REFCLK1 1040, which corresponds to REFCLK1 on line 942, UP/DOWN 1050, which corresponds to the UP/DOWN signal on line 952, and CLKOUT signal 1060, which corresponds to the CLKOUT signal on line 982.

The CLKIN signal 1010 is a periodic signal having a duty cycle that is not 50 percent due to stray capacitances, mismatches between driving circuits rising and falling edge rates, and other sources known to one skilled in the art.

The REFCLK signal 1020 has a frequency that is one-half that of the CLKIN signal 1010. In this particular example, each rising edge of the CLKIN signal 1010 is used to generate a transition in the REFCLK signal 1020. In other embodiments, the falling edge of the CLKIN signal 1010 may be used to generate a transition in the REFCLK signal 1020.

The REFCLK2 signal 1030 is delayed from the REFCLK signal 1020 by a duration. Initially this duration is short, however with succeeding rising edges of the REFCLK 720, the UP/DOWN counter is incremented, thus increasing the delay through the delay elements. Similarly, the REFCLK1 signal 1040 is delayed from the REFCLK2 signal 1030 by a duration.

At rising edge 1042, the rising edge of REFCLK 1020 occurs before the falling edge of REFCLK1 1040. When this happens, the lock signal 1050 transitions to a high and the counter stops incrementing and starts decrementing, as shown by pulse 1052. On successive clock cycles the UP/DOWN-counter typically alternates between counting up and down as the delays through the delay element dither between a state where the delay is slightly too long and one that is slightly too short. At this time, the REFCLK signal 1020 and REFCLK2 signal 1030 are separated by approximately 90 degrees. Similarly, the REFCLK1 signal 1040 and REFCLK2 signal 1030 are separated by approximately 90 degrees. Accordingly, the REFCLK signal 1020 and REFCLK2 signal 1030 may be exclusive-ORed to generate the CLKOUT signal 1060. Alternately, the REFCLK2 signal 1030 and REFCLK1 signal 1040 may be exclusive-ORed to generate the CLKOUT signal 1060.

Figure 11:
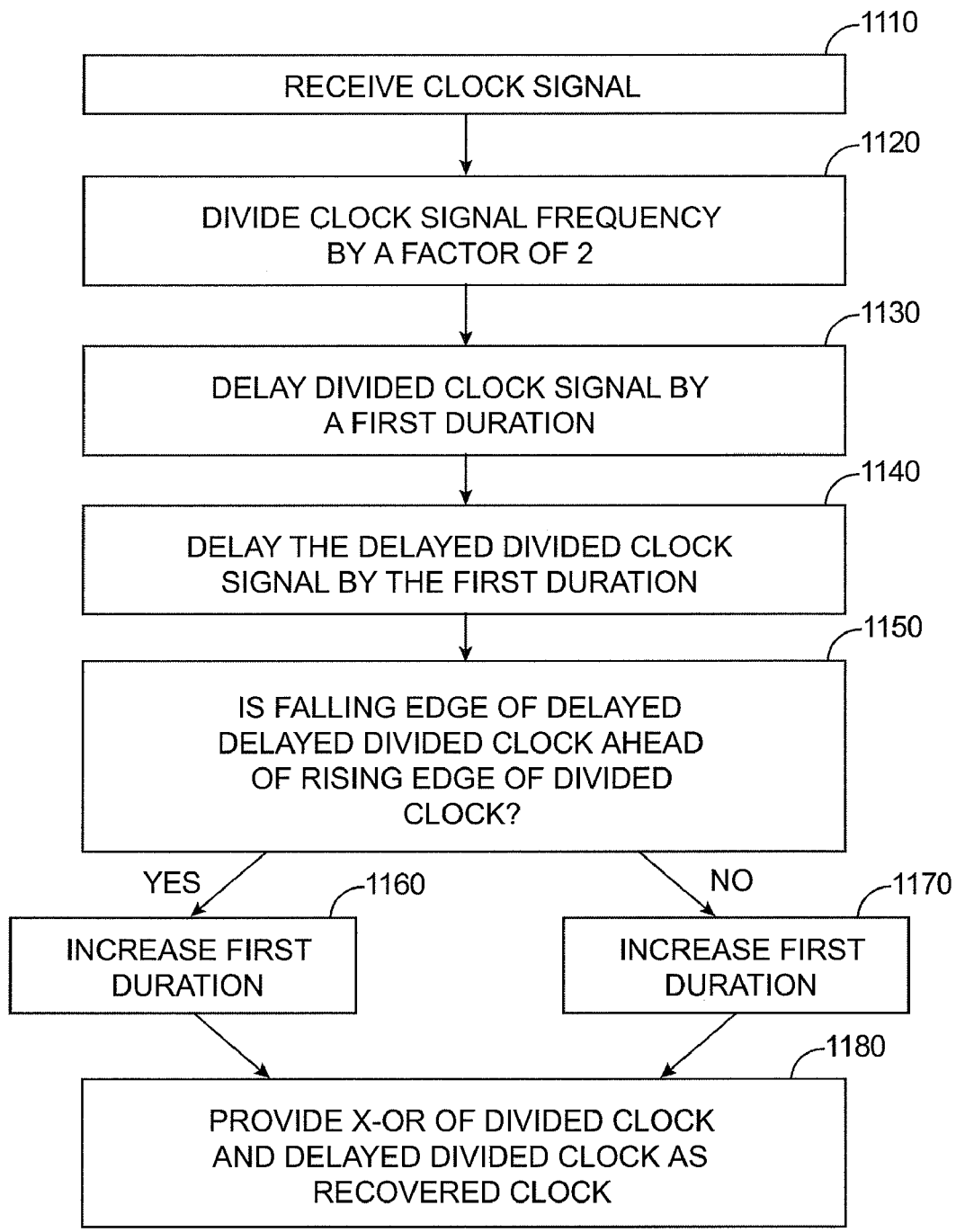
FIG. 11 is a flow chart of another method of improving the duty cycle of a clock signal according to an embodiment of the present invention.

FIG. 11 is a flow chart of another method of improving the duty cycle of a clock signal according to an embodiment of the present invention. In act 1110, a clock signal is received. In act 1120, the frequency of the clock signal is divided by a factor of two. The frequency divided clock signal is delayed by a first duration in act 1130 and the delayed signal is again by this duration in act 1140.

In act 1150, it is determined whether the falling edge of the twice delayed frequency-divided clock signal is leading the rising edge of the frequency-divided clock signal. If it is, then the first duration is increased in act 1160. If it is not, then the first duration is decreased in act 1170. The exclusive-OR of the frequency-divided clock signal and the delayed frequency-divided clock signal may be provided as a duty-cycle improved clock signal in act 1180.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit comprising:
   a frequency dividing circuit to divide a frequency of a clock signal;
   a delay element to generate two frequency-divided signals from the frequency-divided clock signal, the two frequency-divided signals separated by a phase, the phase controlled by a count;
   a counter to selectively count edges of one of the two frequency-divided signals to provide the count, wherein the counter counts edges of the frequency-divided signal until the phase reaches a desired value, after which the counter does not count edges of the frequency-divided signal; and
   a clock generator circuit to generate an improved clock signal from the two frequency-divided signals.

2. The integrated circuit of claim 1 wherein one of the two frequency-divided signals is the frequency-divided clock signal.

3. The integrated circuit of claim 1 wherein the frequency dividing circuit divides the frequency of the clock signal by two.

4. The integrated circuit of claim 1 wherein the desired value for the phase is approximately 90 degrees.

5. The integrated circuit of claim 1 further comprising a selection circuit for selectively providing one of the two frequency-divided signals to the counter.

6. The integrated circuit of claim 5 wherein the selection circuit is a multiplexer.

7. The integrated circuit of claim 6 wherein the counter is incremented by rising edges of the frequency-divided clock signal.

8. The integrated circuit of claim 1 wherein the clock generator circuit is an exclusive-OR gate.

9. The integrated circuit of claim 1 wherein the frequency dividing circuit is a flip-flop.

10. The integrated circuit of claim 1 wherein the integrated circuit is a field-programmable gate array.

11. A method of improving the duty cycle of a clock signal, the method comprising:
    dividing a frequency of a clock signal;
    generating two frequency-divided clock signals from the clock signal, wherein the two frequency-divided clock signals are separated by a phase, the phase adjusted by a control signal;
    generating the control signal by counting edges of a frequency-divided clock signal until a desired phase is reached, then not counting edges of the frequency-divided clock signal; and
    generating a duty-cycle recovered clock signal using the two frequency-divided clock signals.

12. The method of claim 11 wherein the clock signal frequency is divided by two.

13. The method of claim 11 wherein the desired phase is approximately 90 degrees.

14. The method of claim 11 wherein the duty-cycle recovered clock signal is generated by exclusive-ORing the two frequency-divided clock signals.

15. The method of claim 11 wherein the two frequency-divided clock signals are generated by delaying the frequency-divided clock signal by approximately 90 degrees to generate a first delayed frequency-divided clock signal; and
    delaying the first delayed frequency-divided clock signal by approximately 90 degrees to generate a second delayed frequency-divided clock signal.

16. The method of claim 15 further comprising:
    adjusting the phase by comparing the frequency-divided clock signal to the second delayed frequency-divided clock signal.

17. The method of claim 16 wherein the duty-cycle recovered clock signal is generated by exclusive-ORing the frequency-divided clock signal and the first delayed frequency-divided clock signal.

18. The method of claim 16 wherein the duty-cycle recovered clock signal is generated by exclusive-ORing the first delayed frequency-divided clock signal and the second delayed frequency-divided clock signal.

19. A method of improving the duty cycle of a clock signal, the method comprising:
  dividing a frequency of a clock signal;
  delaying the frequency-divided clock signal by a first duration to generate a first delayed signal;
  delaying the first delayed signal by a second duration to generate a second delayed signal; and
  modifying the first and second durations and repeating the delaying steps until the frequency-divided clock signal is a specified number of degrees out of phase with the second delayed signal, then
  not modifying the first and second durations after the frequency-divided clock signal is the specified number of degrees out of phase with the second delayed signal,
  wherein modifying the first and second durations is done by clocking a counter with the second delayed signal and wherein not modifying the first and second durations is done by not clocking the counter.

20. The method of claim 19 further comprising generating an output clock signal by exclusive-ORing the frequency divided clock signal and the first delayed signal.

21. The method of claim 19 further comprising generating an output clock signal by exclusive-ORing the first and second delayed signals.

22. The method of claim 19 wherein the first and second durations are modified by being increased.

23. The method of claim 19 wherein the specified number of degrees is approximately 180.

24. The method of claim 11 wherein when the desired phase is reached, the frequency-divided clock signal is deselected such that edges of the frequency-divided clock signal are not counted.

25. The method of claim 11 wherein when the desired phase is reached, a non-switching signal is selected and the frequency-divided clock signal is deselected such that edges of the frequency-divided clock signal are not counted.

26. The method of claim 19 wherein after the frequency-divided clock signal is the specified number of degrees out of phase with the second delayed signal, the second delayed signal is deselected such that the first and second durations are not modified.

27. The method of claim 19 wherein after the frequency-divided clock signal is the specified number of degrees out of phase with the second delayed signal, a non-switching signal is selected and the second delayed signal is deselected such that the first and second durations are not modified.

28. An integrated circuit comprising:
  a frequency dividing circuit to divide a frequency of a first clock signal;
  a delay element to generate two frequency-divided signals from the frequency-divided clock signal, the two frequency-divided signals separated by a phase, the phase controlled by a count;
  a counter to provide the count;
  a clock generator circuit to generate a second clock signal from the two frequency-divided signals; and
  a selection circuit for selectively providing one of the two frequency-divided signals to the counter.

29. The integrated circuit of claim 28 further comprising:
  a phase detector coupled to receive an output of the frequency dividing circuit and to provide and output to the counter.

30. The integrated circuit of claim 29 wherein one of the two frequency-divided signals is the frequency-divided clock signal.

31. The integrated circuit of claim 29 wherein the frequency dividing circuit divides the frequency of the first clock signal by two.

32. The integrated circuit of claim 29 wherein the desired value for the phase is approximately 90 degrees.

33. The integrated circuit of claim 28 wherein the selection circuit is a multiplexer.

34. An integrated circuit comprising:
  a frequency dividing circuit to divide a frequency of a first clock signal;
  a delay element to generate two frequency-divided signals from the frequency-divided clock signal, the two frequency-divided signals separated by a phase, the phase controlled by a count;
  a counter to provide the count; and
  a clock generator circuit to generate a second clock signal from the two frequency-divided signals,
  wherein the counter is incremented by rising edges of one of the two frequency-divided signals.

35. The integrated circuit of claim 29 wherein the clock generator circuit is an exclusive-OR gate.

36. The integrated circuit of claim 34 further comprising:
  a phase detector coupled to receive an output of the frequency dividing circuit and to provide and output to the counter.

37. The integrated circuit of claim 36 wherein one of the two frequency-divided signals is the frequency-divided clock signal.

38. The integrated circuit of claim 36 wherein the frequency dividing circuit divides the frequency of the first clock signal by two.

39. The integrated circuit of claim 36 wherein the clock generator circuit is an exclusive-OR gate.

* * * * *

UNITED STATES PATENT AND TRADEMARK OFFICE
CERTIFICATE OF CORRECTION

PATENT NO. : 7,675,336 B1  Page 1 of 1
APPLICATION NO. : 11/016394
DATED : March 9, 2010
INVENTOR(S) : Kok Yoong Foo et al.

It is certified that error appears in the above-identified patent and that said Letters Patent is hereby corrected as shown below:

In claim 29, column 10, line 12, please delete the second occurrence of "and" and insert --an--.

In claim 36, column 10, line 40, please delete the second occurrence of "and" and insert --an--.

Signed and Sealed this

Twenty-ninth Day of June, 2010

David J. Kappos
*Director of the United States Patent and Trademark Office*